United States Patent

Marquis

[19]

[11] Patent Number: 5,949,238
[45] Date of Patent: Sep. 7, 1999

[54] METHOD AND APPARATUS FOR PROBING LARGE PIN COUNT INTEGRATED CIRCUITS

[75] Inventor: Steven Russel Marquis, Fall City, Wash.

[73] Assignee: Siemens Medical Systems, Inc., Iselin, N.J.

[21] Appl. No.: 08/575,947

[22] Filed: Dec. 20, 1995

[51] Int. Cl.$^6$ .................................................. G01R 31/28
[52] U.S. Cl. ........................... 324/754; 324/758; 324/765
[58] Field of Search ..................... 324/754, 761, 324/758.1, 755, 765, 758; 439/68, 70, 269, 266

[56] References Cited

U.S. PATENT DOCUMENTS

| | | | |
|---|---|---|---|
| 3,968,433 | 7/1976 | Dobarganes | 324/72.5 |
| 4,352,061 | 9/1982 | Matrone | 324/754 |
| 4,541,676 | 9/1985 | Hansen et al. | 439/68 |
| 4,671,590 | 6/1987 | Ignasiak | 439/266 |
| 4,768,972 | 9/1988 | Ignasiak et al. | 439/70 |
| 4,771,234 | 9/1988 | Cook et al. | 324/754 |
| 4,814,697 | 3/1989 | Kruger | 324/761 |
| 4,904,935 | 2/1990 | Calma et al. | 324/73.1 |
| 4,967,147 | 10/1990 | Woods, Jr. et al. | 324/158 |
| 4,996,476 | 2/1991 | Balyasny et al. | 439/70 |
| 5,134,365 | 7/1992 | Okubo et al. | 324/158 |
| 5,204,615 | 4/1993 | Richards et al. | 324/158 |
| 5,205,741 | 4/1993 | Steen et al. | 324/158.1 |
| 5,339,027 | 8/1994 | Woith et al. | 324/754 |
| 5,355,079 | 10/1994 | Evans et al. | 324/754 |
| 5,376,882 | 12/1994 | Johnson | 324/158.1 |
| 5,415,560 | 5/1995 | Balyasny | 439/269 |
| 5,436,571 | 7/1995 | Karasawa | 324/765 |

FOREIGN PATENT DOCUMENTS

2-51078  2/1990  Japan .

*Primary Examiner*—Vinh P. Nguyen

[57] ABSTRACT

A probing apparatus for probing a large pin count integrated circuit mounted on a circuit board is disclosed. The probing apparatus uses a mounting block and an interconnecting probe body to provide proper alignment of the probing apparatus to pins or pads of the integrated circuit. Since the probing apparatus can be connected while the integrated circuit to be tested is powered up and operational, the probing apparatus facilitates testing of the integrated circuit in real-time. A method for probing a large pin count integrated circuit is also disclosed.

18 Claims, 12 Drawing Sheets

METHOD AND APPARATUS FOR PROBING LARGE PIN COUNT INTEGRATED CIRCUITS

TECHNICAL FIELD

The present invention relates to testing integrated circuits, and more particularly, to a method and apparatus for probing large pin count integrated circuits mounted to a circuit board.

BACKGROUND ART

There are many situations in which integrated circuits mounted on a circuit board need to be tested or monitored in real-time. In such situations, there is no substitute for directly probing an integrated circuit on a circuit board. Such real-time testing is particularly important with complicated integrated circuit chips, like microprocessors, because circuit characterization and debugging is otherwise much more difficult.

As integrated circuits become more complicated, the testing of the integrated circuits becomes more difficult. Integrated circuits often have several hundred connector pins. Hence, although difficult, a probing apparatus must provide reliable electrical contact with each pin in a non-destructive way.

Conventionally, when it is necessary to probe a large-pin count integrated circuit, such as a pin-grid array (PGA), for testing, the circuit board having the integrated circuit mounted thereon is outfitted with a socket (as referred to as a base socket). The socket is directly soldered to the circuit board. When the integrated circuit is not being tested or monitored, the integrated circuit is plugged into the base socket. However, when the integrated circuit is to be tested or monitored, a break-out adapter is plugged into the socket, and the integrated circuit is plugged into the break-out adapter. In effect, the break-out adapter is another socket between the base socket attached to the circuit board and the integrated circuit.

The break-out adapter functions to fan-out signals from each of the pins on the integrated circuit to various stakes positioned on the break-out adapter. Then, typically users would interconnect a logic analyzer to the pins of the integrated circuit by connecting individually terminated test probe leads between the logic analyzer and the stakes. Alternatively, groups of the probe leads would be connected to a common multi-wire ribbon connector which in turn connects to the logic analyzer.

There are several difficulties associated with the conventional approach to probing integrated circuits for testing, particularly those integrated circuits with larger pin counts. The use of a break-out adapter is problematic because the physical size or area of the break-out adapter is typically five to six times the area of the integrated circuit and thus covers the base socket so as to make it difficult or impossible to actuate zero insertion force mechanisms used with many base sockets. As a result, the interconnections between the break-out adapter and the base socket are mechanically unstable and electrically unreliable.

Another difficulty with the conventional probing approach is that integrated circuits cannot be probed without powering down the integrated circuit or the circuit board having the integrated circuit mounted thereon. For example, to attach a break-out adapter the circuit board must be powered down because it requires that the integrated circuit first be removed from the base socket, the break-out adapter be installed into the base socket, and then the integrated circuit be plugged into the break-out adapter. The problem with the conventional probing approach is that the particular state of the integrated circuit which initiated the need to probe the integrated circuit (e.g., device characterization or debug) is lost when powered down. In many cases it is difficult and time consuming to recreate the state of the integrated circuit which initiated the need to probe the integrated circuit. The required power down and later power up are themselves also time consuming.

Additional difficulties of the convention approach are that sockets are required and break-out adapters do not provide decoupling terminations. The conventional approach requires that base sockets for receiving the integrated circuit be soldered to the circuit board. The sockets not only add to the weight and total cost of the circuit board but also reduce reliability. Also, the lack of decoupling terminators with break-out adapters requires that individual probe leads must be used to connect to the break-out adapter and that these leads must be individually terminated. As a result, with large pin-count integrated circuits, such connections require a large amount of time and result in heavy, bulky and cumbersome interconnections to the break-out adapter.

SUMMARY OF THE INVENTION

The invention relates to a method and apparatus for probing a large pin count integrated circuit mounted on a circuit board so that real-time testing of the integrated circuit is facilitated. A probing apparatus according to the invention uses a mounting block and an interconnecting probe body to provide proper alignment of the probing apparatus to pins or pads of the integrated circuit. The invention can be implemented in numerous ways, including as an apparatus or a method. Several implementations are detailed below.

As a probing apparatus for probing an integrated circuit mounted on a circuit board, an embodiment of the invention includes: a mounting block of a predetermined shape affixed relative and proximate to the integrated circuit, and a probe body having a cut-out corresponding to the predetermined shape of the mounting block. The probe body has spring-loaded pins arranged in a predetermined pattern and extending through the probe body. A first side of the probe body is placed over the mounting block so that the mounting block is received in or around the cut-out and a first end of the spring-loaded pins connect to corresponding pins or pads associated with the integrated circuit which are also arranged in the predetermined pattern. The probing apparatus may further include an interface circuit board having connectors which connect to a second end of the spring-loaded pins. In addition, the probe body can be held in place over the mounting block by an attachment device. It may be preferable to affix the mounting block to a bottom side of the circuit board, namely directly under a center region of the integrated circuit. Alternatively, the mounting block can be affixed to a top side of the circuit board or to a top surface of the integrated circuit.

As a portable probing device for probing an integrated circuit mounted on a circuit board, an embodiment of the invention includes: an interface circuit board having holes and wiring connecting the holes to connectors, the holes being arranged in a predetermined pattern; and a probe body affixed to the interface circuit board. The probe body having spring-loaded pins arranged in the predetermined pattern and extending through the probe body. A first side of the probe body having a first end of the spring-loaded pins extending outward from the probe body, and a second side of the probe body having a second end of the spring-loaded pins extending outward from the probe body and placed within and coupled to the holes of the interface circuit board.

As a method for probing an integrated circuit chip mounted on a circuit board, an embodiment of the invention operates to perform the operations of: attaching a mounting block to the circuit board; attaching a probe body to an interface test circuit board, the probe body having a cut-out for receiving the mounting block in a predetermined constrained orientation and position, the probe body also having pins extending through the probe body with a first end coupled to the interface test circuit board; and drawing the probe body over the mounting block so that the mounting block is received in the cut-out in or around the predetermined constrained orientation and position and a second end of the pins connect to pins or pads associated with the integrated circuit. The integrated circuit is thereby connected to the interface circuit board via the pins. The method may also operate to perform the operation of holding the probe body in place over the mounting block.

The invention is able to easily and efficiently probe integrated circuits having a large number of pins in a reliable manner. The invention eliminates the need for socketed devices or removal of the integrated circuit for probing and testing. The invention can apply test probes very quickly while the integrated circuit to be tested is powered up and operational, thus facilitating real-time testing. Further, terminations for decoupling the probe leads from the device under test may be incorporated into the probe apparatus so as to eliminate the large number of individually terminated probe leads conventionally required.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

The invention pertains to a probing apparatus which includes a probe body, a mounting block, an interface board, and an attachment device. The probing apparatus is useful for testing or monitoring a Device Under Test (DUT) mounted on a circuit board. Preferably, the mounting block attaches to the underside of the circuit board and the probe body attaches to the interface board. When testing or monitoring of the DUT is desired, the probe body is drawn over the mounting block and held there with the attachment device. When so connected, the electrical pins or pads of the DUT are electronically coupled to connectors on the interface board. The invention also pertains to a method for probing the DUT.

Figure 1:
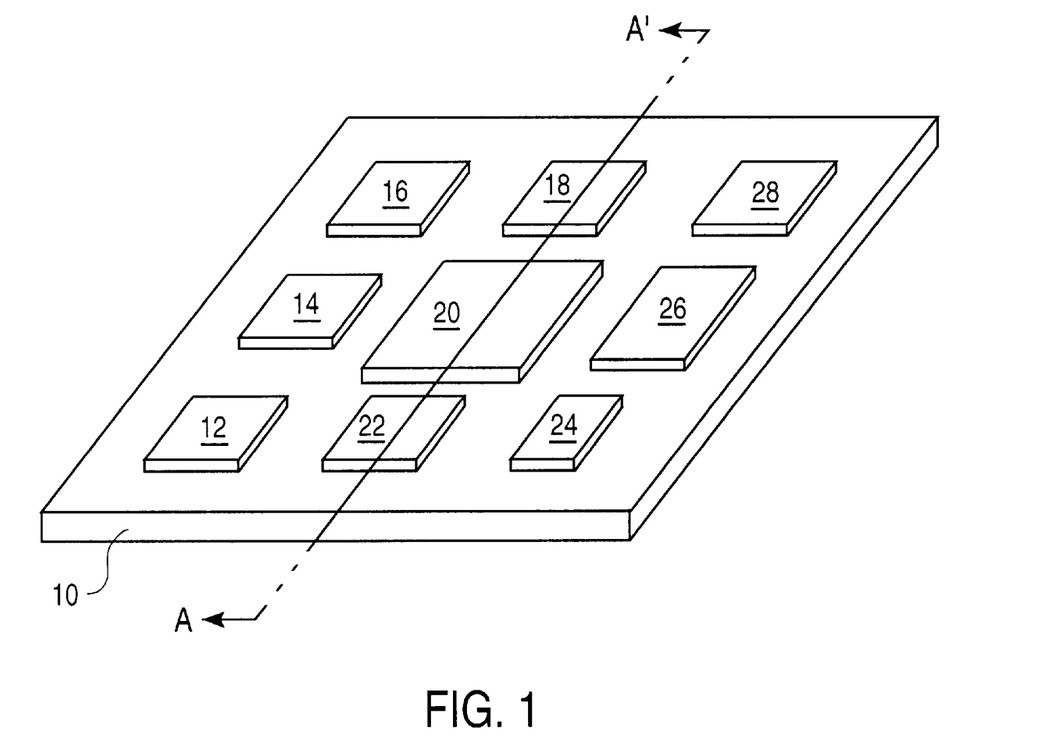
FIG. 1 is a perspective view of a printed circuit board (PCB) having integrated circuits mounted thereon.

FIG. 1 is a perspective view of a printed circuit board (PCB) 10 having integrated circuits 12, 14, 16, 18, 20, 22, 24, 26, and 28 mounted thereon. The integrated circuits 14–28 are, more particularly, packaged integrated circuits of a variety of types. For example, the integrated circuits 12–28 may be packaged in plastic or ceramic, may be leaded or non-leaded, or may be surface mount or non-surface mount.

The integrated circuit 20 is assumed to be the DUT in the following discussion. However, in general, the DUT is an integrated circuit which may be packaged in plastic or ceramic, may be leaded or non-leaded, or may be surface mount or non-surface mount. Since the invention is most useful for high pin count integrated circuits, preferably the integrated circuit being probed according to the invention is a pin-grid array (PGA), a ball-grid array, or a surface mount device for which an accessible fanout is provided. For the purposes of the following discussion, it is assumed that the integrated circuit 20 is a PGA type packaged integrated circuit.

Figure 2:
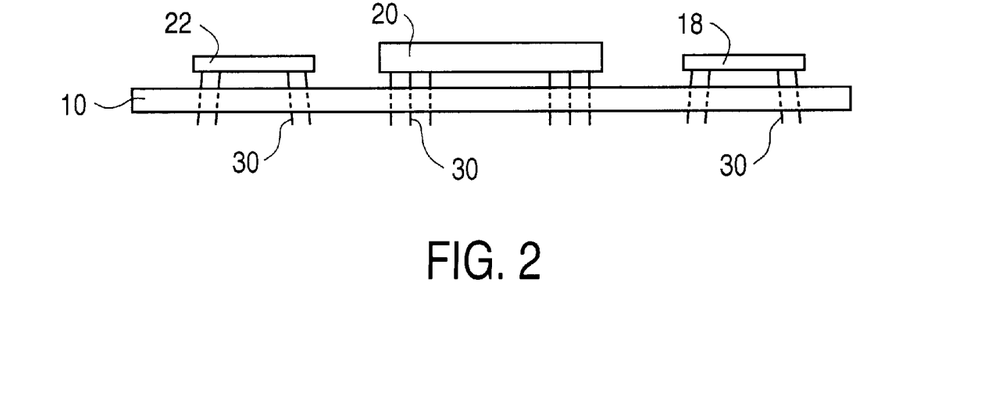
FIG. 2 is a cross-sectional view of the PCB as seen from a reference line A–A' shown in FIG. 1.

FIG. 2 is a cross-sectional view of the PCB 10 as seen from a reference line A–A' shown in FIG. 1. In FIG. 2, the integrated circuits 18, 20 and 22 are shown as having pins 30 protruding through holes (i.e., vias) in the PCB 10. Conventionally, the pins 30 are soldered to the holes on the underside (pin side) of the PCB 10.

Figure 3:
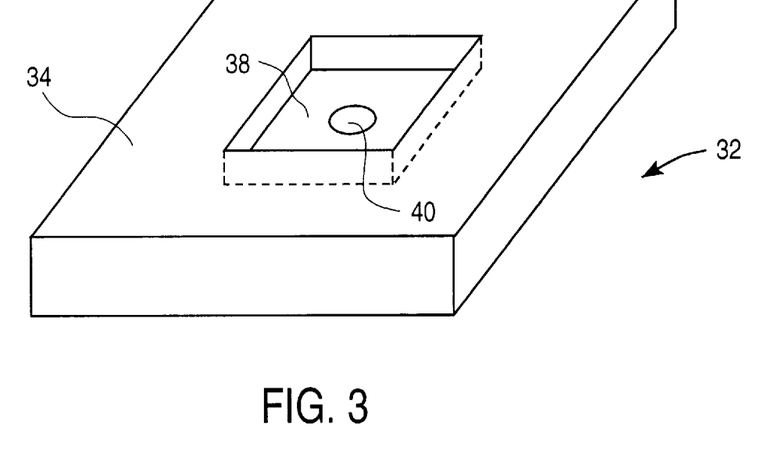
FIG. 3 illustrates a perspective view of a probe body according to an embodiment of the invention.
Figure 4:
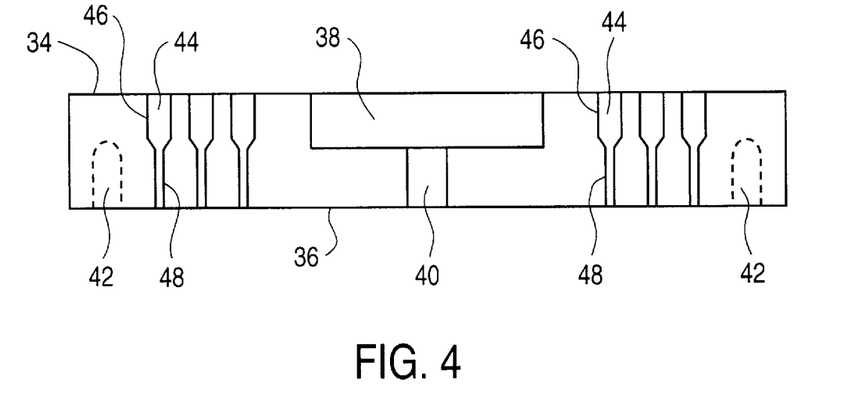
FIG. 4 illustrates a cross-sectional view of the probe body illustrated in FIG. 3.

FIG. 3 illustrates a perspective view of a probe body 32 according to an embodiment of the invention. In this embodiment, the probe body 32 is generally rectangular and has a receiving side 34 and a back side 36 (FIG. 4). An opening (cut-out) 38 is provided on the receiving side 34 of the probe body 32. The opening 38 is centrally placed and extends only partially into the probe body 32. In this embodiment, the opening 38 is also generally rectangular. The probe body 32 also has a hole 40 extending through the center of the probe body 32. The hole 40 is later used by the attachment device. The probe body 32 is fabricated from a non-conductive material. Examples of such non-conductive material include nylon and DELRIN.

FIG. 4 illustrates a cross-sectional view of the probe body 32 illustrated in FIG. 3. Additional details on the probe body 32 are shown in FIG. 4. In particular, mounting holes 42 are provided at each corner of the back side 36 of the probe body 32. The mounting holes 42 are used to mount the probe body 32 onto an interface circuit board (discussed below). The probe body 32 also includes holes 44 extending through the probe body 32. The holes 44 have a wide region 46 near the receiving side 34 and have a narrow region 48 near the backside 36. These openings 44 will be used to hold replaceable spring-loaded test pins known as "pogo" pins as will be discussed in detail below.

Figure 5:
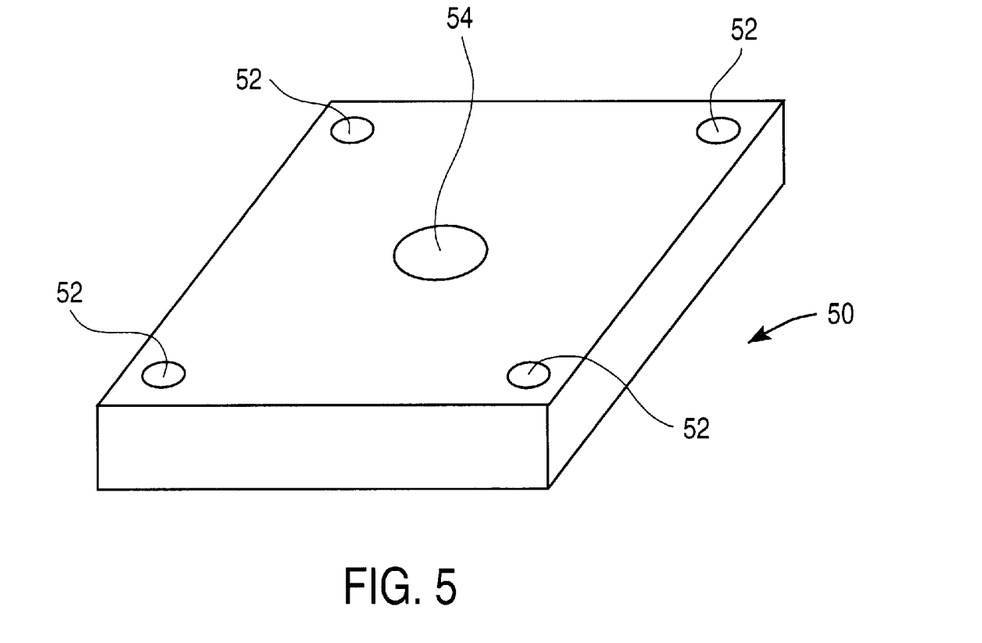
FIG. 5 illustrates a perspective view of a mounting block in accordance with an embodiment of the invention.
Figure 6:
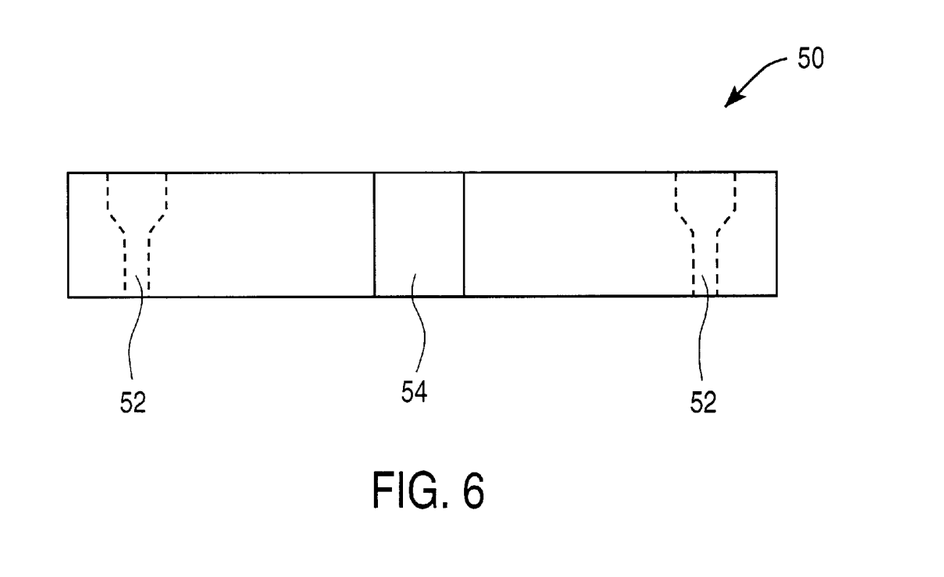
FIG. 6 illustrates a cross-sectional view of the mounting block illustrated in FIG. 5.

FIG. 5 illustrates a perspective view of a mounting block 50 in accordance with an embodiment the invention, and FIG. 6 illustrates a cross-sectional view of the mounting block 50 illustrated in FIG. 5. The mounting block 50 is a generally rectangular block-like structure having mounting openings 52 and a center opening 54. The mounting openings 52 are recessed to receive screws that operate to attach the mounting block 50 to the circuit board having the DUT mounted thereon. Although FIG. 5 illustrates four mounting openings 52, only two mounting openings at diametrically opposed corners of the mounting block 50 are required. The center opening 54 is used by the attachment device. Preferably, the mounting block 50 is also fabricated from a non-conductive material.

Figure 7:
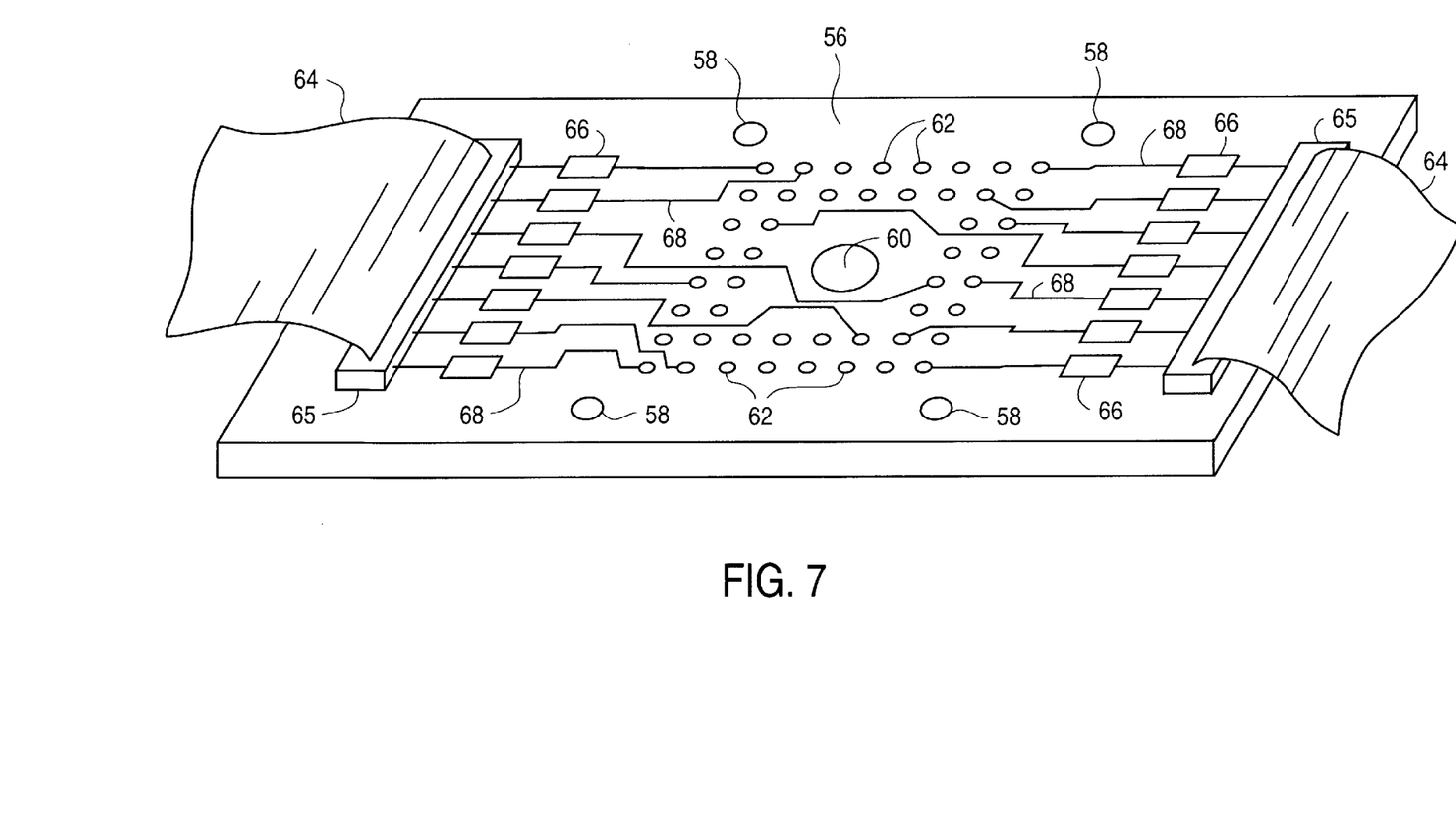
FIG. 7 is a perspective view of an interface circuit board according to an embodiment of the invention.

FIG. 7 is a perspective view of an interface circuit board 56 according to an embodiment of the invention. The interface circuit board 56 includes mounting openings 58 for mounting the interface circuit board 56 to the back side 36 of the probe body 32. An attachment opening 60 extends through the interface circuit board 56 for use by the attachment device. The interface circuit board 56 also includes a plurality of holes 62 (i.e., vias) which extend through the interface circuit board 56. The holes 62 receive one end of the "pogo" pins which are placed in the openings 44 of the probe body 32 when the probe body 32 is affixed to the interface circuit board 56. Ribbon cables 64 connect the interface circuit board 56 to testing machines such as a logic analyzer, an emulator, or an oscilloscope. The ribbon cables 64 may connect to the interface circuit board 56 at ribbon connectors 65. The various wires within the ribbon cables 64 are respectively connected to particular holes 62 via individual terminators 66 and wiring 68. The terminators 66 are affixed to the interface circuit board 56. Preferably, the terminators 66 are either buried in the interface circuit board 56 or surface mounted. As known in the art, the terminators 66 operate to reduce the coupling between the DUT and the test machine so that the signals being probed are not significantly altered due to the loading affect of the wiring and electronics associated with the test machine. The placement of wiring 68, the holes 62, the terminators 66, and the ribbon cables 64 are merely illustrative of such connections as numerous arrangements are understood by those skilled in the art.

A probing method according to an embodiment of the invention is illustrated in FIGS. 8A–8C and FIG. 9. Once it is determined that the integrated circuit 20 is to be tested, the integrated circuit 20 becomes the DUT.

Figure 8A:
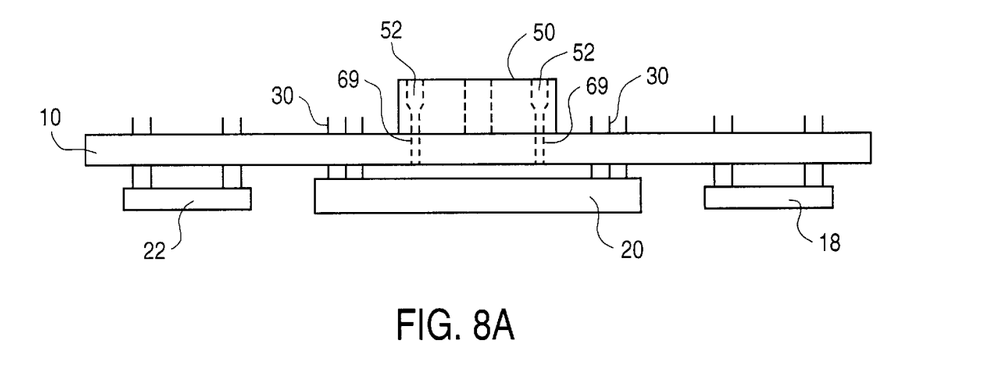
FIGS. 8A–8C are cross-sectional views illustrating assembly of a probing apparatus according to an embodiment of the invention.

First, the mounting block 50 is attached (76) to the PCB 10. As illustrated in FIG. 8A, the mounting block 50 is mounted to the PCB 10 on the underside of the PCB 10 below the center of the integrated circuit 20. Hence, in this embodiment, the mounting block 50 fits within the bounded region created by the pins of the integrated circuit 20. For example, in a two inch by two inch integrated circuit PGA package, a center region of about one inch by one inch is often free of pins and therefore available to receive the mounting block 50. In such a case, the mounting block 50 would have a size slightly less than one inch by one inch. However, in other cases, when the center region is not sufficiently clear, the mounting block 50 must be mounted elsewhere as discussed later below.

Figure 8B:
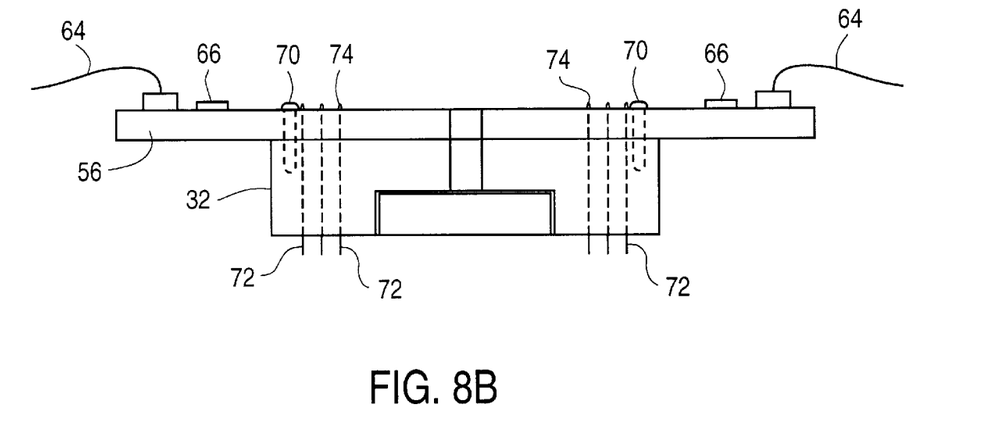
Figure 8C:
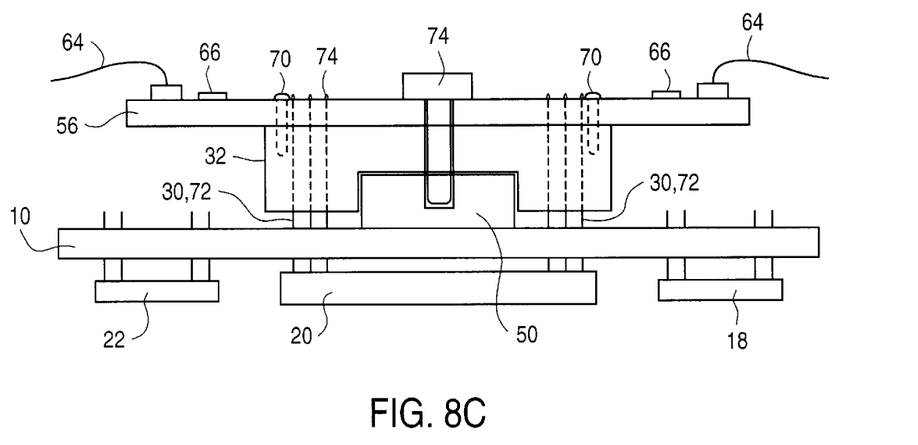
Figure 9:
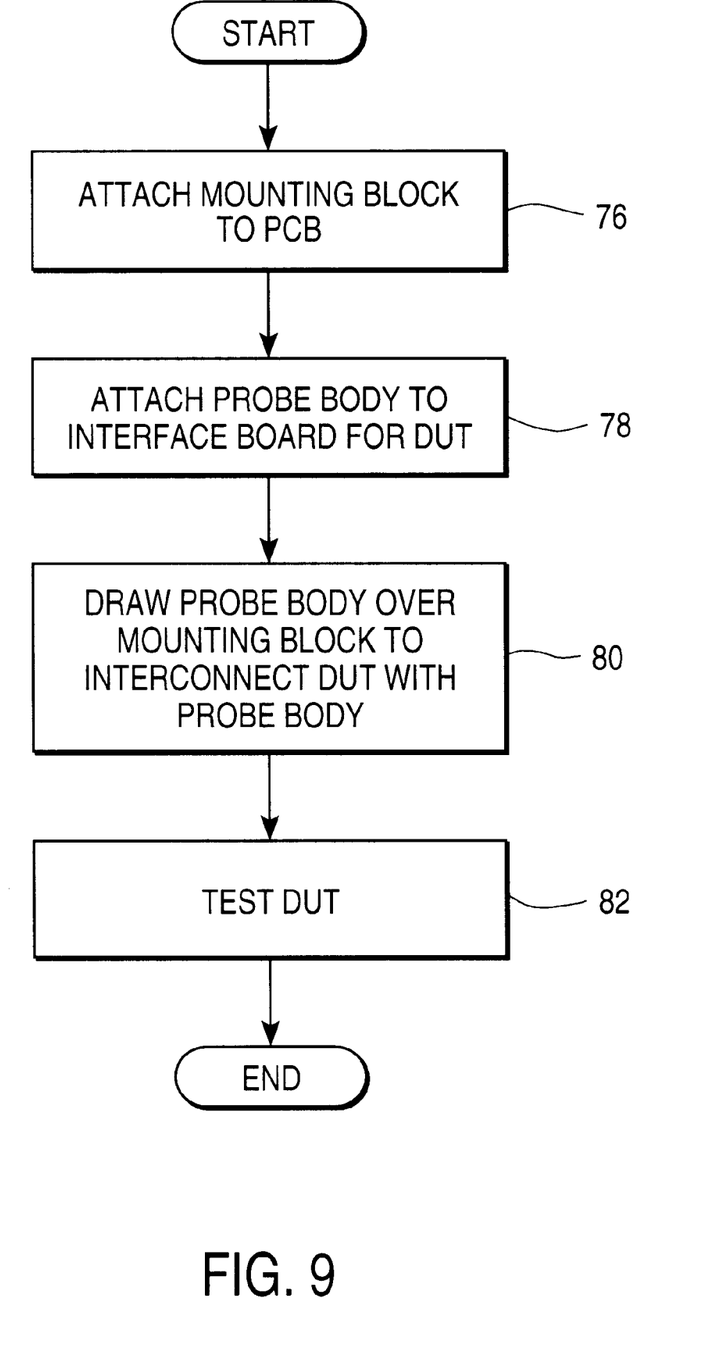
FIG. 9 is a flow diagram of a probing method according to an embodiment of the invention.

In the embodiment illustrated in FIGS. 8A–8C, the mounting block 50 is attached to the underside (non-chip side) of the PCB 10 by screws placed in mounting holes 52. The screws placed in the mounting holes fasten to threaded inserts 69 (FIG. 8A) formed in the PCB 10. Alternatively, the mounting block 50 can be attached to the PCB 10 using a thermal adhesive; however, an alignment template would be needed to properly align the mounting block with the integrated circuit to be tested. An example of an alignment template is described below with reference to FIG. 14.

Next, the probe body 32 is attached (78) to the interface circuit board 56 for the DUT. That is, the interface circuit board 56 would normally be pre-designed for a particular integrated circuit. Hence, the probe body 32 would get attached (78) to the interface circuit board 56 specific to the DUT (i.e., the integrated circuit to be tested). FIG. 8B illustrates the attachment of the probe body 32 to the interface circuit board 56. Screws 70 pass through the mounting openings 58 and then thread into the mounting openings 42 of the probe body 32 which are suitably threaded. When attached, the opening 60 in the interface circuit board 56 aligns with the opening 40 in the probe body 32. The "pogo" pins 72 extend through the holes 44 in the probe body 32 as well as through the holes 62 in the interface circuit board 56. One end of the "pogo" pins 72 are connected to the upper surface of the interface circuit board 56 using solder 74. The other end of the "pogo" pins 72 extend below the probe body 32 as connector pins 72. A central portion of the "pogo" pins contains a spring member that connects with both of the ends and is held in the wide region 46 of the openings 44.

Thereafter, the probe body 32 is drawn (80) over the mounting block 50 to interconnect the DUT with the probe body 32. FIG. 8C illustrates the probing apparatus in its operational arrangement. From this operational arrangement, the DUT can be tested (82). As shown in FIG. 8C, a screw 74 operates as the attachment device to attach and affix the probe body 32 (as well as the interface board 56) to the mounting block 50 (as well as the PCB 10 and the DUT). The "pogo" pins 72 extending through the probe body 32 are compressed against individual pins, solder bumps, via holes or circuit board lands on the underside of the PCB 10 that are associated with pins or pads of the DUT (i.e., integrated circuit 20). Thus, the pins or pads of the DUT are electrically connected in a mechanically stable way to the wires within the ribbon cables 64.

The mounting block 50 and the opening 38 in the probe body 32 are machined such that when the probe body 32 is drawn over the mounting block 50, there is a snug and tight fit which ensures proper alignment of the "pogo" pins 72 with the pins 30 of the DUT (i.e., integrated circuit 20) (FIG. 8C). The screw 74 is threaded so that it threads into the opening 54 of the mounting block 50 which is also suitably threaded. The relative orientation of the probe body 32 with DUT is preferably achieved by a notch or other keying means formed in one side or corner of the opening 38 of the probe body 32 and a corresponding mating notch or key formed in the mounting block 50. From this operational arrangement (FIG. 8C), the DUT can be monitored or tested (82) by connecting the ribbon connectors 64 on the interface circuit board 56 to a testing machine such as a logic analyzer, an emulator, or an oscilloscope.

Figure 10:
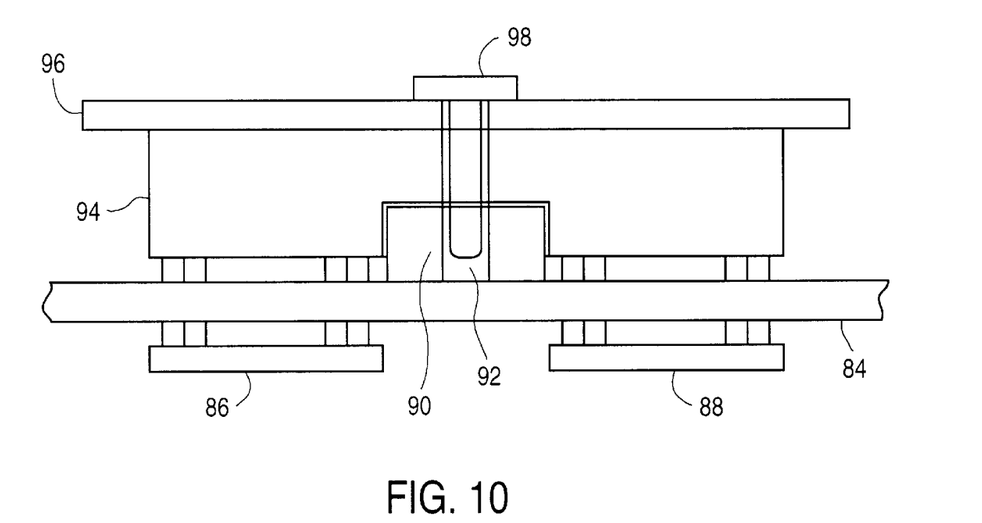
FIG. 10 is a cross-sectional view of another embodiment of an assembled probe apparatus according to the invention.

In other embodiments of the invention, the mounting block need not be attached to the underside center region of a PCB directly under the DUT. The mounting block could, for example, be placed adjacent to the DUT, instead of in the center region. As another example, a probing apparatus could be designed in accordance with the invention for probing two integrated circuits on a common circuit board, such a design would be useful for testing a chip-set. In which case, a single mounting block could be placed near or adjacent both the two integrated circuits or two separate mounting blocks could be placed on the PCB adjacent to (or in center region of) the two integrated circuits. The corresponding interface board would support either a single probe body or a combined probe body. FIG. 10 illustrates an example of one of these other embodiments.

FIG. 10 is a cross-sectional view of another embodiment of an assembled probe apparatus according to the invention. In this embodiment, the probe apparatus is capable of probing two integrated circuits. A circuit board 84 has integrated circuits 86 and 88 mounted thereon. Both the integrated circuits 86 and 88 are DUTs in this embodiment. A mounting block 90 is affixed to the underside of the circuit board 84 similar to the embodiment discussed above, except that here the mounting block 90 is located between (or adjacent to) the DUTs. A probe body 94 has holes and "pogo" pins as discussed above. In this embodiment, the probe body 94 is for both DUTs; hence, the holes and the "pogo" pins of the probe body 94 service both the DUTs. An interface board 96 is affixed to a top side of the probe body 95. When assembled, the probe body 94 is drawn over the mounting block 90 such that the mounting block 90 closely fits within an opening (cut-out) of the probe body 94. An attachment device 98 serves to secure the probe apparatus in its assembled condition. The mounting block 90 has a center opening 92 that is used by the attachment device 98 to secure the probe body 94 to the circuit board 84.

Figure 11:
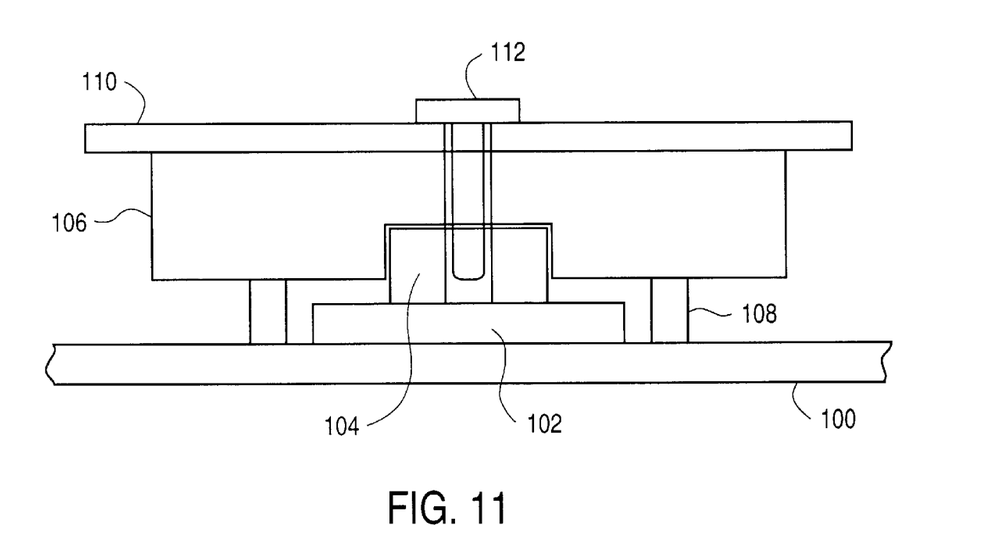
FIG. 11 is a cross-sectional view of still another embodiment of an assembled probe apparatus according to the invention.

In addition, depending on the type of packaging for the integrated circuit serving as the DUT, the mounting block could also be attached to the top (or chip side) of the PCB. FIG. 11 is a cross-sectional view of an embodiment of an assembled probe apparatus according to an embodiment of the invention in which a mounting block is attached to the top side of the PCB. In FIG. 11, a PCB 100 has an integrated circuit 102, such as a surface mounted integrated circuit package, mounted thereon. The integrated circuit 102 is the DUT. A mounting block 104 is then affixed to the top of the DUT. The mounting block might also be machined to fit over and around the DUT to force proper alignment of the mounting block 104 to the DUT. Preferably, an adhesive is used to affix the mounting block 104 to the DUT after proper alignment. A probe body 106 has spring-loaded connector pins 108 as in previously described embodiments, but here the connector pins 108 individually contact pads or wire traces on the top side of the PCB 100. An interface board 110 is affixed to the probe body 106 and is the same as shown in FIG. 7. An attachment device 112 holds the probe apparatus in its assembled state.

Figure 12A:
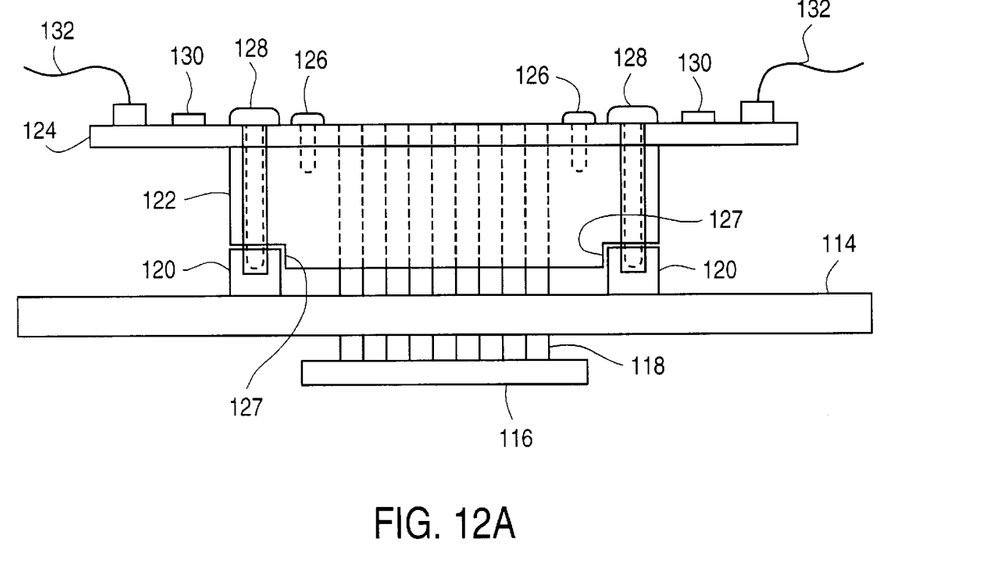
FIG. 12A is a cross-sectional view of yet another embodiment of an assembled probe apparatus according to the invention.
Figure 12B:
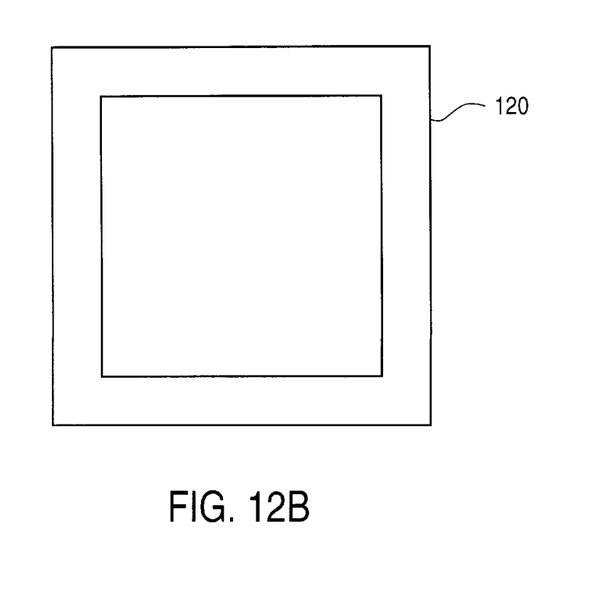
FIG. 12B is a top view of a mounting block for use with the embodiment of the invention shown in FIG. 12A.

FIG. 12A is a cross-sectional view of yet another embodiment of an assembled probe apparatus according to the invention. In this embodiment, the probe apparatus is capable of probing integrated circuits which do not have a center region free of pins or pads. A circuit board 114 has an integrated circuit 116 mounted thereon with pins 118 extending through and connecting with the circuit board 114. The integrated circuit 116 is the DUT in this embodiment. A mounting block 120 is affixed to the underside of the circuit board 114 similar to the embodiment discussed above, except that here the mounting block 120 surrounds the periphery of the integrated circuit 116. FIG. 12B is a top view of the mounting block 120. This embodiment is particularly suitable for probing integrated circuits which do not have a center region free of pins or pads. A probe body 122 has holes and "pogo" pins similar to other embodiments discussed above.

An interface board 124 is affixed to a top side of the probe body 122 using screws 126. The interface board 124 includes terminators 130 and ribbon cables 132 as did previously described embodiments. When assembled, the probe body 122 is drawn within the mounting block 120 such that the mounting block 120 closely fits against a notch (cut-out) 127 of the probe body 122. Attachment devices 128 serve to secure the probe apparatus in its assembled condition.

Figure 12C:
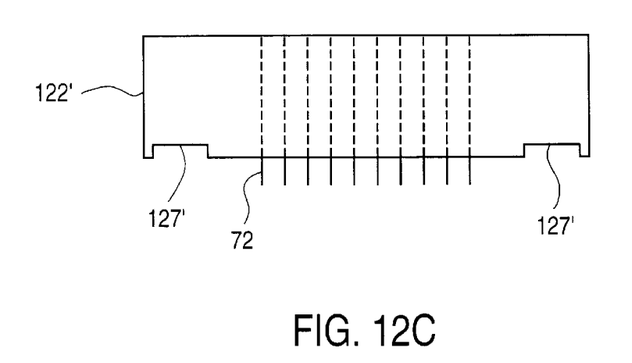
FIG. 12C is a cross-sectional view of an alternative configuration for the probe body shown in FIG. 12A.

FIG. 12C is a cross-sectional view of an alternative configuration for the probe body 122 illustrated in FIG. 12A. In particular, a probe body 122' has a notch 127'(cut-out), otherwise the probe body 122' is the same as the probe body 122.

Figure 13:
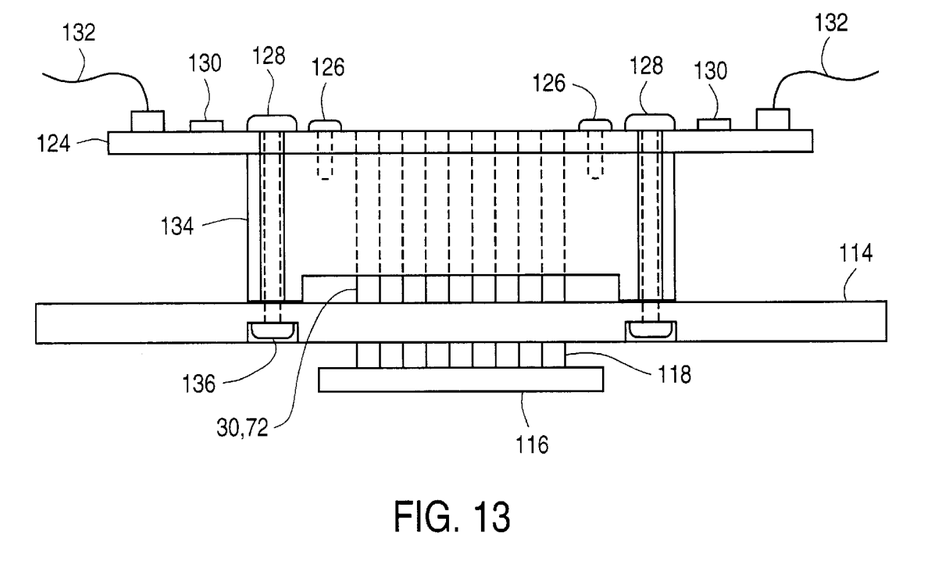
FIG. 13 is a cross-sectional view of still another embodiment of an assembled probe apparatus according to the invention.

FIG. 13 is a cross-sectional view of still another embodiment of an assembled probe apparatus according to the invention. This embodiment is similar to the embodiment discussed above with reference to FIG. 12B. The differences are that here the probe body 122 and the mounting block 120 are actually combined into a probe body 134 which serves to provide the functions of both. The probe body 134 is mounted to the backside of the circuit board 114 via the attachment devices 128 which in this embodiment threads into nuts 136. The nuts 136 are preferably recessed into the circuit board 114. The disadvantage of this embodiment is that the forces caused by the "pogo" pins 72 are more concentrated on the portions of the circuit board 114 near the nuts 136, whereas the use of a mounting block (as in other embodiments) serves to better distribute these forces throughout the mounting block (and consequently the circuit board 114). Hence, other embodiments of the invention are preferred over this embodiments, particularly when probing large pin count integrated circuits.

Figure 14:
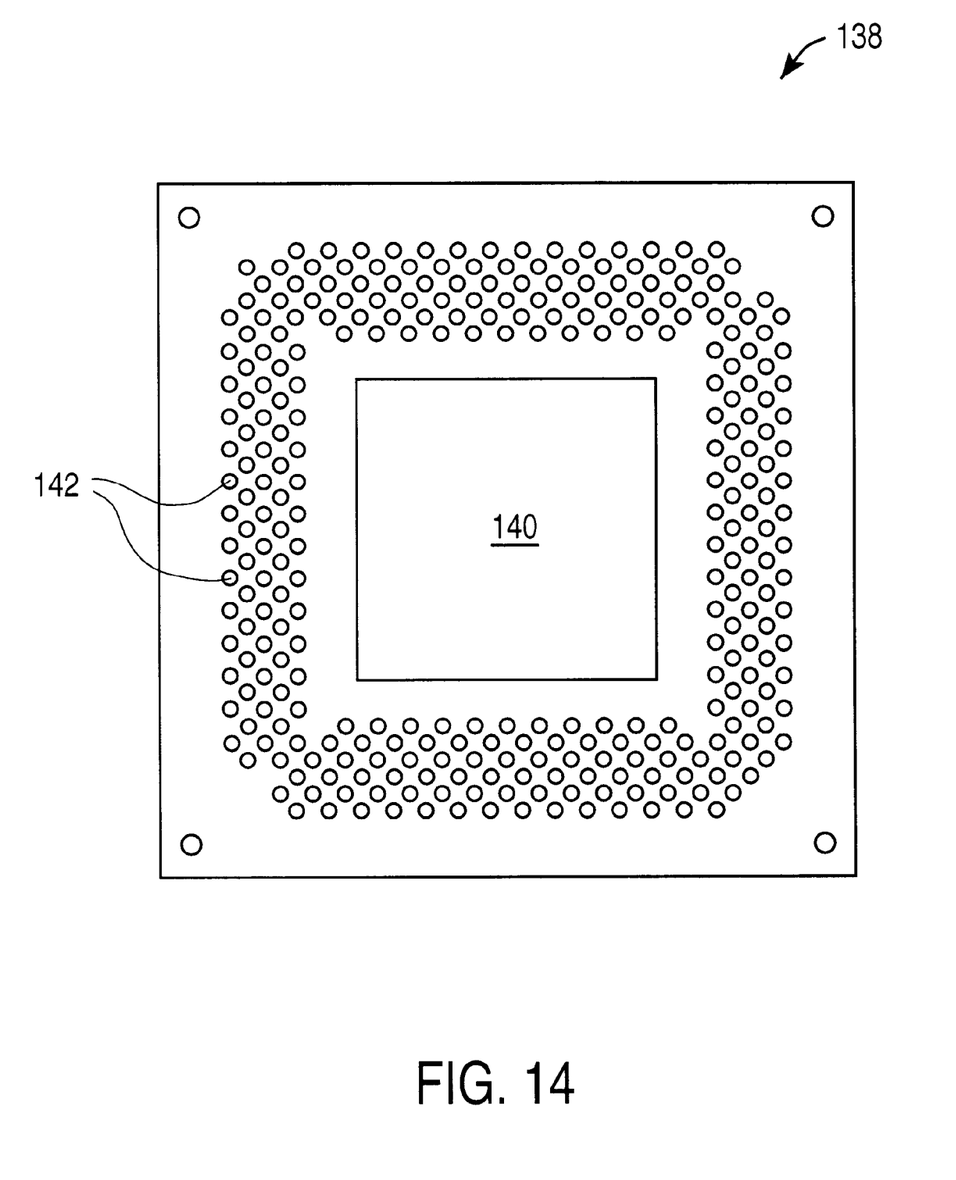
FIG. 14 is top view of an alignment template used to align the mounting block to the DUT.

FIG. 14 is top view of an alignment template 134 which may be used to align the mounting block to the DUT in the case where an adhesive is used to affix the mounting block to the circuit board. The alignment template 114 has a opening 116 that matches the shape of the mounting block. The alignment template 114 also has a plurality of holes 118 that match against the pins, pads, or vias of the circuit board. Hence, using the alignment template 114 the mounting block (such as mounting block 50 illustrated in FIG. 8C) can be aligned with the DUT and then adhered in place with a thermal adhesive.

Several modifications for the above embodiments are available. The size of the mounting block and probe body will vary with the size of the DUT. The shape of the mounting block and the corresponding shape of the opening (cut-out) in the probe body need not be rectangular, but can take any shape. The above embodiments affix the interface board directly to the probe body, but the interface board could also be spaced apart from the probe body with spacers and additional wiring connecting the "pogo" pins to the interface board. Although the above embodiments illustrated PGA and surface mount packaged integrated circuits as the DUT, as mentioned previously, other types of packaged integrated circuits are also usable with the present invention.

The invention is able to easily and efficiently probe integrated circuits having a large number of pins in a reliable manner. The invention eliminates the need for socketed devices or removal of the DUT for probing and testing. The invention can apply test probes very quickly while the integrated circuit to be tested is powered up and operational, thus facilitating real-time testing. Further, terminations for decoupling the probe leads from the device under test may be incorporated into the probe apparatus so as to eliminate the large number of individually terminated probe leads conventionally required.

What is claimed is:

1. A probing apparatus for probing an integrated circuit mounted on a circuit board, said probing apparatus comprising:

a mounting block of a predetermined shape affixed to the circuit board relative and proximate to the integrated circuit; and a probe body having a cut-out corresponding to the predetermined shape of said mounting block, said probe body having spring-loaded pins arranged in a predetermined pattern and extending through said probe body, a first side of said probe body being placed over said mounting block so that said mounting block is received in or around the cut-out and a first end of the spring-loaded pins couple to corresponding pins or pads associated with the integrated circuit which are also arranged in the predetermined pattern, wherein said probing apparatus is able to test the integrated circuit while being mounted on the circuit board.

2. A probing apparatus as recited in claim 1, wherein said probing apparatus further comprises:

an interface circuit board having holes and wiring connecting the holes to connectors, the holes being arranged in a predetermined pattern, and wherein said probe body has a second side, and the second side of said probe body is affixed to said interface circuit board such that a second end of the spring-loaded pins are placed within the holes of said interface circuit board.

3. A probing apparatus as recited in claim 2, wherein the second end of each of the spring-loaded pins connects to the holes within which they are placed.

4. A probing apparatus as recited in claim 3, wherein said interface board further includes decoupling terminators, and wherein the wiring of said interface circuit board connects the holes with the connectors via the decoupling terminators, a plurality of the holes being respectively coupled to one of the decoupling terminators.

5. A probing apparatus as recited in claim 2, wherein said mounting block is affixed to a bottom side of the circuit board.

6. A probing apparatus as recited in claim 2, wherein the mounting block is affixed to a bottom side of the circuit board directly under a center region of the integrated circuit.

7. A probing apparatus as recited in claim 1, wherein the mounting block is affixed to a bottom side of the circuit board directly under a center region of the integrated circuit.

8. A probing apparatus as recited in claim 1, wherein said mounting block is affixed to a top side of the circuit board or to a top surface of the integrated circuit itself.

9. A probing apparatus as recited in claim 1, wherein said probe body is held in place over said mounting block by an attachment device.

10. A probing apparatus as recited in claim 1, wherein said probing apparatus further comprises an interface circuit board having connectors, and wherein a second end of the spring-loaded pins are operatively connected to the connectors of said interface circuit board.

11. A probing apparatus as recited in claim 10, wherein said probe body is held in place over said mounting block by an attachment device.

12. A probing apparatus as recited in claim 11, wherein said attachment device further holds said interface board stationary relative to said probe body.

13. A probing apparatus as recited in claim 12, wherein said attachment device is a threaded screw, and wherein said interface board and said probe body have an opening extending therethrough for receiving said screw, and said mounting block has a threaded opening for receiving and threading against the threaded screw.

14. A probing apparatus as recited in claim 1, wherein the cut-out in said probe body causes said mounting block to be received in a predetermined constrained orientation and position.

15. A probing apparatus as recited in claim 14, wherein the integrated circuit is a packaged integrated circuit chip.

16. A method for probing an integrated circuit chip mounted on a circuit board, said method comprising:

(a) attaching a mounting block to the circuit board;

(b) attaching a probe body to an interface test circuit board, the probe body having a cut-out for receiving the mounting block in a predetermined constrained orientation and position, the probe body also having pins extending through the probe body with a first end of the pins coupled to the interface test circuit board;

(c) drawing the probe body over the mounting block so that the mounting block is received in or around the cut-out in the predetermined constrained orientation and position and a second end of the pins connect to pins or pads associated with the integrated circuit chip, thereby affixing the probe body to the circuit board and electrically connecting the integrated circuit chip to the interface circuit board via the pins; and (d) thereafter probing the integrated circuit chip while being mounting on the circuit board.

17. A method as recited in claim 16, wherein the pins extending through the probe body are spring-loaded, and wherein the integrated circuit is a packaged integrated circuit chip.

18. A method as recited in claim 16, wherein said method further comprises:

(d) holding the probe body in place over the mounting block.

* * * * *